United States Patent [19]

Chen et al.

[11] Patent Number: 5,102,827
[45] Date of Patent: Apr. 7, 1992

[54] CONTACT METALLIZATION OF SEMICONDUCTOR INTEGRATED-CIRCUIT DEVICES

[75] Inventors: Min-Liang Chen, Wescosville; Chung W. Leung, Allentown, both of Pa.

[73] Assignee: AT&T Bell Laboratories, Murray Hill, N.J.

[21] Appl. No.: 732,947

[22] Filed: Jul. 19, 1991

Related U.S. Application Data

[63] Continuation of Ser. No. 359,450, May 31, 1989, abandoned.

[51] Int. Cl.$^5$ .............................. H01L 21/44
[52] U.S. Cl. ..................... 437/200; 437/192; 437/194; 437/190; 437/34
[58] Field of Search ............... 437/34, 190, 192, 194, 437/200

[56] References Cited

U.S. PATENT DOCUMENTS

| | | | |
|---|---|---|---|
| 4,107,726 | 8/1978 | Schilling | 357/71 |
| 4,319,395 | 3/1982 | Lund et al. | 437/41 |
| 4,361,599 | 11/1982 | Wourms | 427/90 |
| 4,398,335 | 8/1983 | Lehrer | 29/577 |
| 4,502,209 | 3/1985 | Eizenberg et al. | 29/589 |
| 4,535,532 | 8/1985 | Lancaster | 437/34 |
| 4,701,349 | 10/1987 | Koyanagi et al. | 437/228 |
| 4,709,467 | 12/1987 | Liu | 437/175 |
| 4,782,380 | 11/1988 | Shankar et al. | 357/67 R |
| 4,783,248 | 11/1988 | Kohlhase et al. | 204/192.17 |
| 4,784,973 | 11/1988 | Stevens et al. | 437/192 |
| 4,788,160 | 11/1988 | Havemann et al. | 437/192 |
| 4,873,204 | 10/1989 | Wong et al. | 437/193 |
| 4,877,755 | 10/1989 | Rodder | 437/200 |
| 4,897,703 | 1/1990 | Spratt et al. | 357/34 |

*Primary Examiner*—Brian E. Hearn
*Assistant Examiner*—Trung Dang
*Attorney, Agent, or Firm*—Richard D. Laumann

[57] ABSTRACT

In the manufacture of semiconductor integrated-circuit devices, electrical contact to semiconductor regions such as, e.g., source and drain regions of field-effect transistors typically is made by a structure in which a silicide is intermediary to silicon and metal. The invention provides for processing, after window formation and before metal deposition, which includes deposition of a silicide-forming material, and annealing in a non-oxidizing atmosphere. Preferably, the atmosphere includes a component which forms a conductive compound with the silicide-forming material. Resulting contact structures have good step coverage, low contact resistance, low interdiffusion of metal into semiconductor, and fail-safe operation in the event of breaks due to electromigration. Moreover, in the case of misalignment of a window, a contact region may be extended laterally by dopant diffusion, thereby safeguarding the junction. Tolerance to window misalignment permits increased packing density, e.g., in dynamic random-access memory arrays.

12 Claims, 5 Drawing Sheets

CONTACT METALLIZATION OF SEMICONDUCTOR INTEGRATED-CIRCUIT DEVICES

This application is a continuation of application Ser. No. 07/359,450, filed on May 31, 1989, now abandoned.

TECHNICAL FIELD

The invention is concerned with semiconductor integrated-circuit devices including a metallization.

BACKGROUND OF THE INVENTION

Making electrical contact to semiconductor regions such as, e.g., source, drain, and gate regions of a field-effect transistor typically involves the deposition of a metallization over a dielectric which has been patterned to produce openings (windows, holes, vias) to the underlying semiconductor structure. While, currently, aluminum is the material most widely used for semiconductor device metallization, other materials such as, e.g., tungsten and cobalt are also receiving attention. And, primarily in the interest of reduced contact resistance, contact structures have been proposed including one or more additional layers intermediate to metallization and semiconductor materials: for example, in the case of source and drain regions in silicon devices, a layer of titanium silicide is advantageously included between the silicon semiconductor and aluminum metallization materials.

Contact structures and methods for their fabrication have evolved as motivated by a variety of concerns relating not only to contact resistance, but also to step coverage, to electromigration, and to interdiffusion. The following background art is considered as representative in addressing such concerns:

U.S. Pat. No. 4,107,726, issued Aug. 15, 1978 to H. Schilling, discloses metallizations in which aluminum overlies a thin layer of titanium which, in turn, overlies a layer of platinum silicide in contact windows;

U.S. Pat. No. 4,361,599, issued Nov. 30, 1982 to R. L. Wourms discloses a plasma-etching process for making contact openings in a dielectric material, underlying silicide regions serving to inhibit over-etching;

U.S. Pat. No. 4,398,335, issued Aug. 16, 1983 to W. I. Lehrer discloses a silicide metallization which is made by depositing silicon on a dielectric, followed by depositing of a silicide-forming material;

U.S. Pat. No. 4,502,209, issued Mar. 5, 1985 to M. E. Eizenberg et al. discloses exemplary contact structures comprising layers of aluminum, titanium carbide, and titanium silicide on silicon, as well as other, similar multilayer metallization structures.

Quite generally, desirable contact structures in semiconductor integrated-circuit devices have low contact resistance, good step coverage, and protection against interdiffusion and electromigration. In the following, with such desiderata in mind, attention is directed to a contact structure comprising a silicide layer and a metallization layer, and especially to the interface between such layers.

SUMMARY OF THE INVENTION

In the manufacture of semiconductor integrated-circuit devices, electrical contacts preferably are made by a method which includes, after window etching, steps of depositing silicide-forming material and annealing in a non-oxidizing atmosphere; preferably, such atmosphere promotes the formation of a conductive compound with the silicide-forming material. After annealing, contact metal is deposited. Processing in accordance with the invention is of particular interest as applied to devices in which window size is less than or equal to 1 micrometer. Preferred metallizations comprise aluminum, and titanium is preferred as a silicide-forming material. Preferably, in the latter case, the non-oxidizing atmosphere comprises nitrogen.

For the sake of clarity, the elements of the devices depicted in the Figures are not drawn to scale.

DETAILED DESCRIPTION

Figure 1:
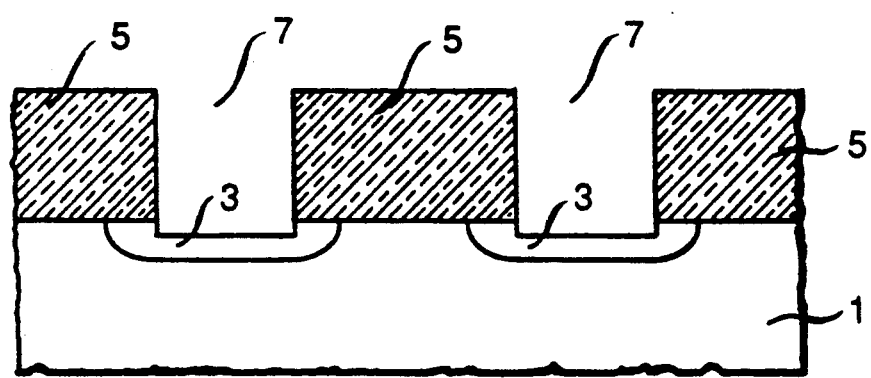
FIGS. 1-4 are enlarged side views of a first exemplary device at different stages of preferred metallization processing of the invention.

FIG. 1 shows substrate 1, contact regions 3, and dielectric layer 5, with openings 7 exposing portions of regions 3; such openings typically are made by photolithographic processing involving etching in the presence of a patterned mask layer.

Contact openings may be, e.g., to source or drain regions of field-effect transistors, or to contact regions intended for device interconnection. Typically, in the latter case, contact is made to silicon in polycrystalline form. Contact regions typically comprise heavily doped silicon, and they may further comprise a surface region of a silicide such as, e.g., titanium silicide which was formed prior to deposition of dielectric layer 5. The dielectric may consist essentially of an oxide.

Figure 2:
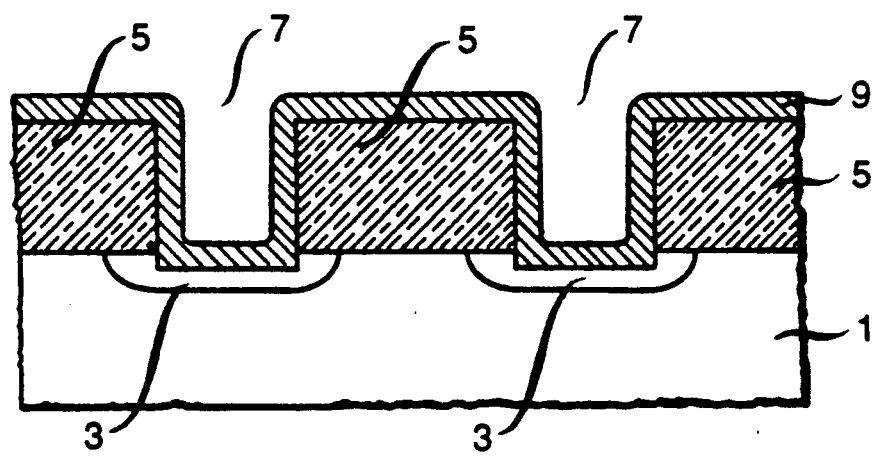

FIG. 2 shows the device of FIG. 1 after further processing involving the deposition of silicide-forming layer 9, exemplary device features 1, 3, 5, and 7 here and throughout being the same as in FIG. 1. Layer 9 may consist essentially of titanium, and deposition may be by sputtering; the choice of material and of the deposition method is influenced by considerations of adhesions and step coverage. In the case of titanium, preferred thickness of layer 9 is in a range from 10 to 100 nanometers, 60 nanometers being typical.

At this point, preferred processing calls for (rapid) thermal annealing in a non-oxidizing atmosphere such as, e.g., a nitrogen atmosphere; such annealing involves (short-term) heating at an elevated temperature, e.g., by exposure to infrared radiation. For a 60-nanometer layer of titanium, preferred annealing is at a temperature in the range from 750 to 950 degrees C. for a duration in the range from 10 seconds to 1 minute, lower temperatures corresponding to longer times and conversely. An exemplary temperature is approximately 800 degrees C, with a corresponding time of approximately 20 seconds. More generally, time and temperature may be chosen to effect substantial conversion of the material of layer 9 into (i) silicide adjacent to the substrate, and (ii) a conductive surface compound with an atmospheric constituent such as, e.g., nitrogen. In the case of windows to formerly silicided regions, annealing fosters replenishment of silicide lost in the course of window etching. Also, annealing may result in the removal of surface oxides and contaminants.

Figure 3:
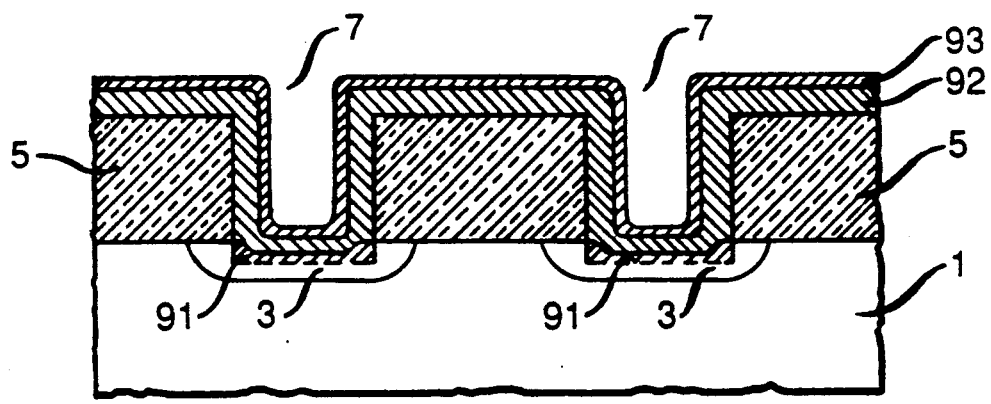

FIG. 3 shows the device of FIG. 2 after annealing, layer 9 now comprising sublayers 91, 92, and 93. Layer 91 consists essentially of silicide as formed due to reaction of deposited silicide-forming material with silicon, layer 92 consists essentially of unreacted silicide-forming material, and layer 93 consists essentially of a nitride of the silicide-forming material, as illustrative of the case in which the annealing atmosphere comprises nitrogen.

Figure 4:
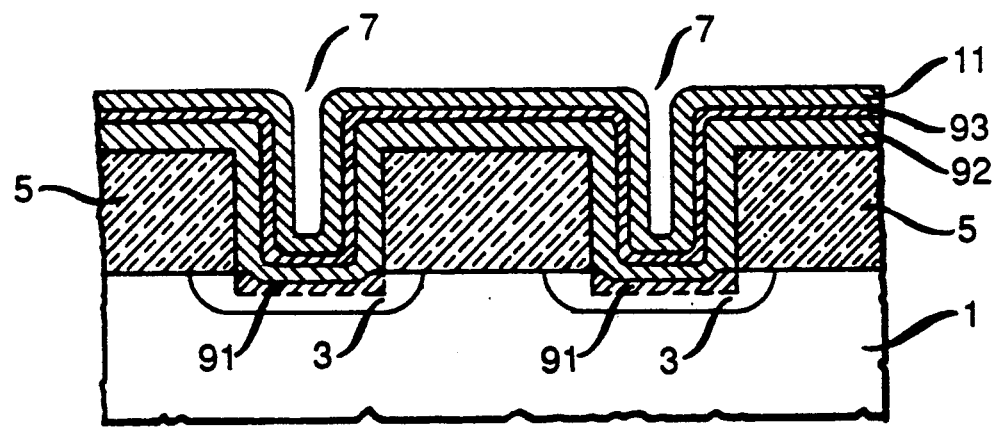

FIG. 4 shows the device of FIG. 3 after further deposition of a metallization layer 11, typically consisting essentially of aluminum comprising a small amount of silicon or copper, and having a thickness which is in a typical range from 400 nanometers to 1.2 micrometers. At this point, the device is ready for further processing as is well-understood in the art.

Preferred processing in accordance with the invention may be used, e.g., in the manufacture of complementary metal-oxide semiconductor (CMOS) devices, including n-channel and p-channel field-effect transistors on a common substrate. Such processing yields metallizations with good step coverage and, when a preferred conductive compound is formed between the silicide and the metallization, with protection against interdiffusion or "spiking". A conductive compound can further serve as a built-in safeguard and electrical path in case of interruption of the metallization due to electromigration.

Processing of the invention may also involve metallization metals other than aluminum, tungsten being considered a particularly suitable alternative. Also, a deposited silicide-forming material may be alloyed not only with the underlying silicon, but also with the metallization, and this will apply especially in the case of a tungsten metallization. Among materials other than titanium, suitable as a silicide-forming material, are cobalt, platinum, and alloys of titanium, cobalt, and platinum. Other than nitrogen, suitable as an inert atmospheric constituent during annealing, argon or helium may be used, as well as mixtures of such gases.

A further benefit of preferred processing in accordance with the invention relates to tolerance with respect to misalignment of etched windows relative to the semiconductor structure. This aspect of the invention is illustrated by FIGS. 5-8 which, in addition to features described above in connection with FIGS. 1-4, show field oxide 51 and doped region 52. In the case of an n-channel device, substrate 1 is p-doped, and region 52 is doped n+, e.g., with arsenic and/or phosphorus. In the case of a p-channel device, the substrate is n-doped, and region 52 is doped p+, e.g., with boron.

Figure 5:
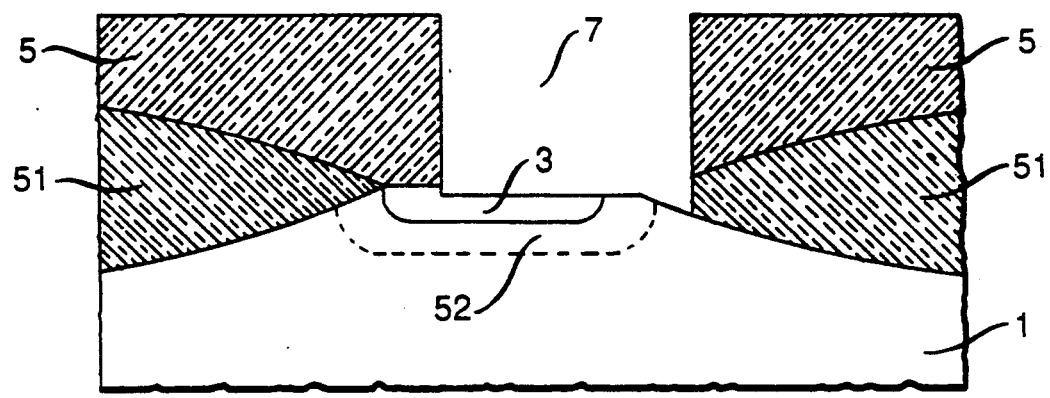
FIGS. 5-8 are enlarged side views of a second exemplary device at different stages of preferred metallization processing of the invention.
Figure 6:
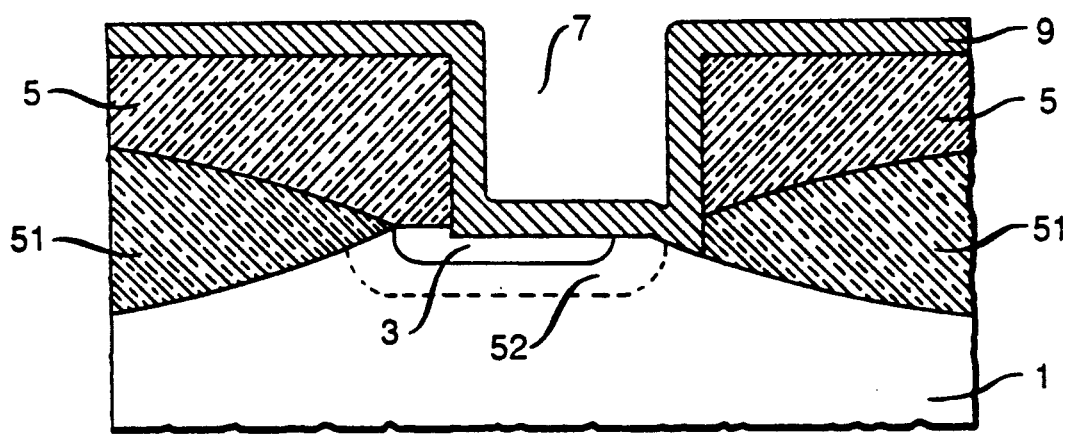
Figure 7:
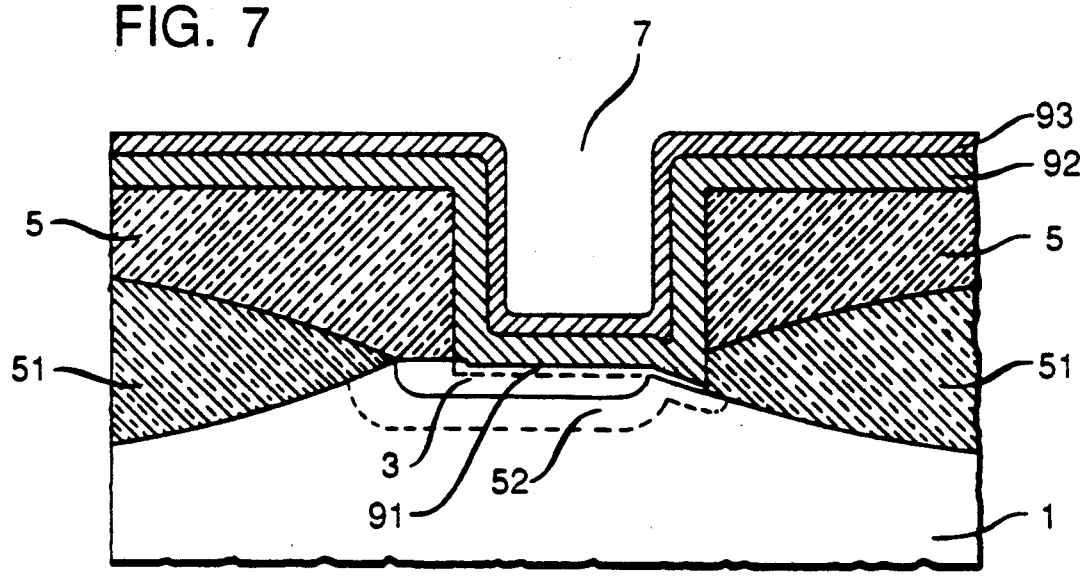

In FIG. 5, window 7 is shown etched such that not only a portion of silicide region 3 is uncovered but, due to (unintended) misalignment, also a portion of substrate 1. In accordance with prior-art deposition of a metallization, such latter portion would be ineffective as part of the intended contact, and its presence would lead to shorting between a doped tub in the substrate and a source or drain contact. Such inefficacy and shorting are prevented by preferred processing in accordance with the invention in that the junction is extended essentially coextensive with the window as etched.

Figure 8:
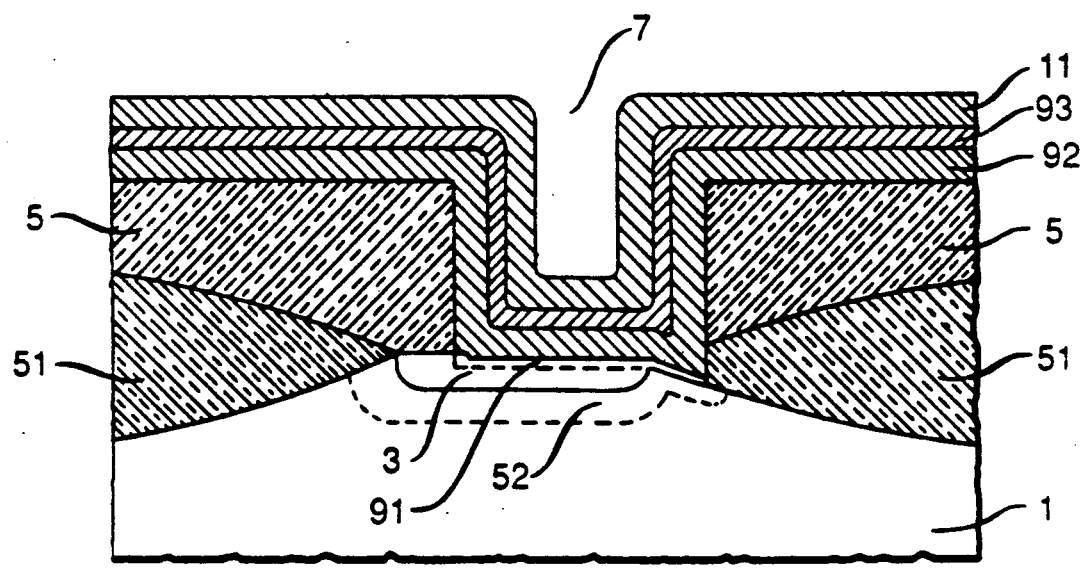

More specifically, after deposition of silicide-forming layer 9 (FIG. 6), and as a result of annealing (FIG. 7), impurities have diffused laterally, resulting in extension of doped region 52. (In this respect, arsenic is preferred as n-type dopant on account of its high diffusivity in silicide.) Also, additionally formed silicide 91 extends over the newly doped region, thereby resulting in the formation of an efficacious contact in spite of misalignment of the window. The final structure including metallization layer 11 is shown in FIG. 8.

Further to processing as described above, in the interest of supplying additional n-type dopant to formerly undoped window regions, it may be desirable to include a step of phosphorus implantation prior to deposition of silicide-forming material. In this respect, in the case of CMOS processing, a dose not exceeding approximately $10^{14}/cm^2$ may be chosen so as to avoid excessive counterdoping of exposed contact areas of p-channel devices. Higher doses may be preferred in the case of n-channel metal-oxide semiconductor (NMOS) device processing.

Tolerance to misalignment is particularly beneficial in the manufacture of NMOS-dominated devices such as, e.g., dynamic random-access memory (DRAM) arrays. In such and similar devices, preferred processing may permit the use of so-called headless contacts to active areas whose width is the same as the window width—thus permitting the use of more narrow active areas, and closer spacing of active areas on a chip. This is illustrated by FIG. 9 and 10 which show two adjacent active areas 81, and windows 82.

Figure 9:
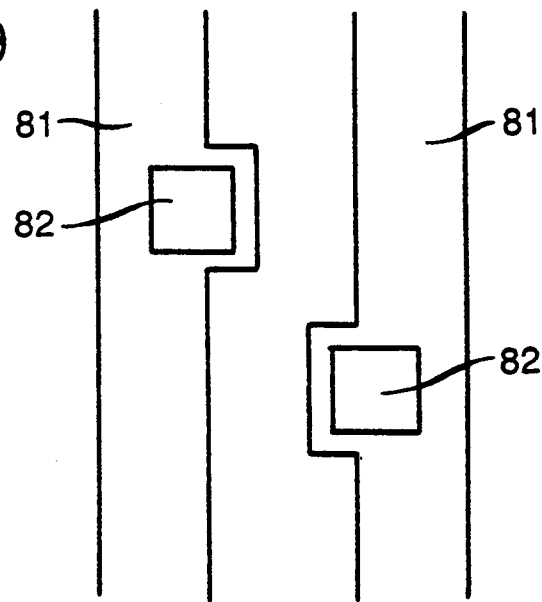
FIGS. 9 and 10 are enlarged top views of windows etched into a dielectric as placed relative to underlying semiconductor active areas.

In FIG. 9, windows 82 are etched at widened portions of the active area 81 as is typical in prior-art practice. Widened areas are included to provide a margin of window misalignment relative to the active area, as well as a margin of window oversize as may occur during window patterning.

Figure 10:
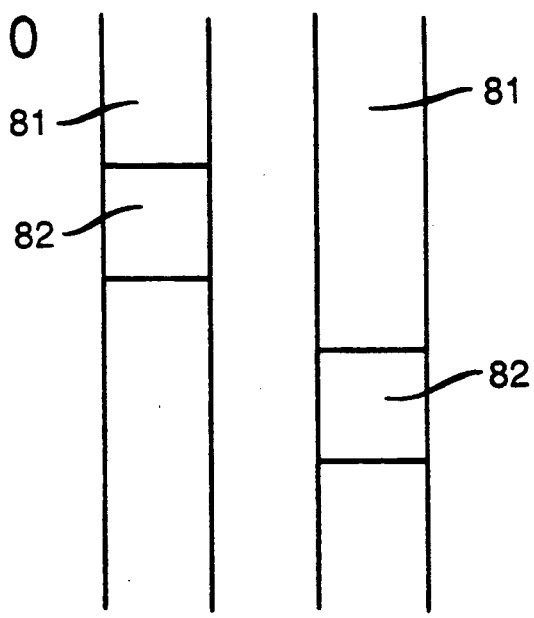

FIG. 10, by contrast, illustrates the use of an active area 81 which nominally has the same width as windows 82, as made practicable due to processing in accordance with the invention, potential window misalignment or oversize being compensated for by extension of the junction as described above. It is readily apparent upon inspection of FIG. 9 and 10 that, given a specified window size and a specified minimum distance between adjacent active areas, less space is occupied by the active areas in FIG. 10 as compared with FIG. 9.

We claim:

1. In the manufacture of semiconductor integrated-circuit devices, a method for making electrical contact to at least one contact region on a semiconductor body, said method comprising the steps of depositing a dielectric layer on said body, etching an opening into said dielectric layer, said opening exposing an area which comprises at least a portion of said contact region, said contact region comprising a silicide formed before said etching step, implanting phosphorous after depositing said dielectric layer and etching said opening, depositing silicide-forming material after etching and implanting, heating in a non-oxidizing atmosphere, and depositing a metal layer.

2. The method of claim 1 in which said contact region comprises titanium silicide.

3. The method of claim 1 in which said silicide-forming material comprises titanium.

4. The method of claim 1 in which said atmosphere comprises a constituent which promotes formation of a conductive compound with said silicide-forming material.

5. The method of claim 4 in which said silicide-forming material comprises titanium, and in which said atmosphere comprises nitrogen.

6. The method of claim 5 in which said layer of silicide-forming material consists essentially of titanium and has a thickness in the range from 10 to 100 nanometers, and in which heating is at a temperature in the range from 750 to 950 degrees C. and for a duration in the range from 10 seconds to 1 minute, lower temperatures corresponding to longer times and conversely.

7. The method of claim 1, said contact being in a CMOS structure, and the dose of phosphorus implantation being less than or equal to $10^{14}/cm^2$.

8. The method of claim 1 in which said openings have a width which is less than or equal to 1 micrometer.

9. A method of manufacturing an integrated circuit comprising the steps of:

forming an electrical contact region on a semiconductor body, said region comprising a silicide;

depositing, after said forming, a dielectric layer on said body and said contact region;

etching an opening into said dielectric layer, said opening exposing an area which comprises at least a portion of silicide of said contact region;

depositing silicide-forming material after said etching;

heating in a non-oxidizing atmosphere; and depositing a metal layer.

10. A method as recited in claim 9 in which said contact regions comprise titanium silicide.

11. A method as recited in claim 9 in which said silicide forming material comprises titanium.

12. A method as recited in claim 9 in which said atmosphere comprises a constituent which promotes formation of a conductive compound with said silicide forming material.

* * * * *